(12) United States Patent
Bruce et al.

(10) Patent No.: US 7,842,534 B2
(45) Date of Patent: Nov. 30, 2010

(54) METHOD FOR FORMING A COMPOUND SEMI-CONDUCTOR THIN-FILM

(75) Inventors: Allan James Bruce, Scotch Plains, NJ (US); Sergey Frolov, Murray Hill, NJ (US); Michael Cyrus, Summit, NJ (US)

(73) Assignee: Sunlight Photonics Inc., South Plainfield, NJ (US)

( * ) Notice: Subject to any disclaimer, the term of this patent is extended or adjusted under 35 U.S.C. 154(b) by 201 days.

(21) Appl. No.: 12/061,450

(22) Filed: Apr. 2, 2008

(65) Prior Publication Data
US 2009/0250722 A1 Oct. 8, 2009

(51) Int. Cl.
*H01L 21/00* (2006.01)

(52) U.S. Cl. ............... 438/93; 438/94; 438/572; 438/796; 438/E31.008

(58) Field of Classification Search ......... 438/93–95, 438/572, 796, 46–47, 77, 285, 483, 590, 438/718, 602–604, 767, 779
See application file for complete search history.

(56) References Cited

U.S. PATENT DOCUMENTS

| | | | |
|---|---|---|---|
| 3,978,510 A | 8/1976 | Kasper et al. | |
| 4,181,256 A | 1/1980 | Kasagi | |
| 4,335,266 A | 6/1982 | Mickelsen et al. | |
| 4,652,332 A | 3/1987 | Ciszek | |
| 4,740,386 A | 4/1988 | Cheung | |
| 4,798,660 A | 1/1989 | Ermer et al. | |
| 5,441,897 A | 8/1995 | Noufi et al. | |
| 5,445,847 A | 8/1995 | Wada et al. | |
| 5,567,469 A | 10/1996 | Wada et al. | |
| 5,626,688 A | 5/1997 | Probst et al. | |
| 5,985,691 A | 11/1999 | Basol | |
| 6,107,562 A | 8/2000 | Hashimoto et al. | |
| 6,127,202 A | 10/2000 | Kapur et al. | |
| 6,258,620 B1 | 7/2001 | Morel et al. | |
| 6,420,036 B1 | 7/2002 | Varaprasad et al. | |
| 6,559,372 B2 | 5/2003 | Stanbery | |
| 6,974,976 B2 | 12/2005 | Hollars | |

(Continued)

FOREIGN PATENT DOCUMENTS

JP 9326499 A 12/1997

(Continued)

OTHER PUBLICATIONS

P.K. Johnson et al., "A Compartive Study of Defect States in Evaporated and Selenized CIGS(S) Solar Cells", Publication date unknown, but prior to the filing date of the instant application, pp. 1-17.

(Continued)

*Primary Examiner*—Dung A. Le
(74) *Attorney, Agent, or Firm*—Mayer & Williams PC; Stuart H. Mayer

(57) ABSTRACT

A method is provided for fabricating a thin film semiconductor device. The method includes providing a plurality of raw semiconductor materials. The raw semiconductor materials undergo a pre-reacting process to form a homogeneous compound semiconductor target material. The compound semiconductor target material is deposited onto a substrate to form a thin film having a composition substantially the same as a composition of the compound semiconductor target material.

17 Claims, 2 Drawing Sheets

U.S. PATENT DOCUMENTS

| | | | |
|---|---|---|---|
| 7,026,258 | B2 | 4/2006 | Taunier et al. |
| 7,101,627 | B2 | 9/2006 | MacDonald et al. |
| 7,306,823 | B2 | 12/2007 | Sager et al. |
| 7,537,955 | B2 | 5/2009 | Basol |
| 2002/0043279 | A1 | 4/2002 | Karg |
| 2003/0178104 | A1 | 9/2003 | Sekine |
| 2003/0219544 | A1 | 11/2003 | Smith |
| 2005/0056312 | A1 | 3/2005 | Young et al. |
| 2005/0183768 | A1 | 8/2005 | Roscheisen et al. |
| 2005/0236032 | A1 | 10/2005 | Aoki |
| 2006/0008928 | A1 | 1/2006 | Beppu et al. |
| 2006/0210640 | A1 | 9/2006 | Kerkhof |
| 2007/0111367 | A1* | 5/2007 | Basol ............ 438/95 |
| 2008/0038555 | A1 | 2/2008 | Sekine et al. |
| 2008/0041532 | A1 | 2/2008 | Chou et al. |
| 2008/0057203 | A1 | 3/2008 | Robinson et al. |
| 2008/0057616 | A1 | 3/2008 | Robinson et al. |
| 2008/0121277 | A1 | 5/2008 | Robinson et al. |
| 2008/0124831 | A1 | 5/2008 | Robinson et al. |
| 2008/0175982 | A1 | 7/2008 | Robinson et al. |
| 2008/0196760 | A1 | 8/2008 | Hayes et al. |
| 2008/0226270 | A1 | 9/2008 | Wendt et al. |
| 2009/0107550 | A1 | 4/2009 | van Durgen et al. |
| 2009/0162969 | A1 | 6/2009 | Basol |
| 2009/0229666 | A1 | 9/2009 | Corneille et al. |
| 2010/0029036 | A1 | 2/2010 | Robinson et al. |

FOREIGN PATENT DOCUMENTS

| JP | 2007096031 | 4/2007 |
|---|---|---|
| KR | 100246712 B1 | 3/2000 |

OTHER PUBLICATIONS

Gregory M. Hanket et al., "Growth of Cu(InGA)(SeS)2 by the Reaction of Cu-GA-In Precursors in H2Se and H2S", University of Delaware, Institute of Energy Conservation, Publication date unknown, but prior to the filing date of the instant application, 2pgs.

T. Pisarkiewicz et al., "Fabrication of thin film polycrystalline CIS photovoltaic hetrostructure", Opto-Electron. Rev., vol. 11, No. 4, (2003), pp. 297-304.

Rommel Noufi and Ken Zweibel, "High-Efficiency CDTE and CIGS Thin-Film Solar Cells: Highlights and Challenges", National Renewable Energy Laboratory, Golden, CO., Publication date unknown, but prior to the filing date of the instant application, 4pgs.

B. von Roedern et al., "Polycrystalline Thin-Film Photovoltaics: From the Laboratory to Solar Fields", May 2006, National Renewable Energy Laboratory, Golden, CO., pp. 1-4.

M. Raja Reddy, "Thin film solar cells for low cost space applications", European Space Agency, Dec. 1998, pp. 2-41.

Peter T. Erslev et al., "Study of the Electronic Properties of Matched Na-containing and Na-free CIGS Samples Using Junction Capacitance Methods", Publication date unknown, but prior to the filing date of the instant application, 6pgs.

Roecker, R., Spray Technology, Brochure D03, Southwest Research Institute, 1998, 4 pages.

Eberspacher, C. et al., "Thin-film CIS alloy PV materials fabricated using non-vacuum, particles-based techniques," Thin Solid Films 387 (2001), pp. 18-22.

D. Bremaud et al., "Towards the Development of Flexible CIGS Solar Cells on Polymer Films with Efficiency Exceeding 15%", Publication date unknown, but prior to the filing date of the instant application, 4pgs.

* cited by examiner

METHOD FOR FORMING A COMPOUND SEMI-CONDUCTOR THIN-FILM

FIELD OF INVENTION

The present invention relates to a method for forming a compound semiconductor thin-film such as a semiconductor thin-film suitable for use in photovoltaic solar cells and other devices.

BACKGROUND OF THE INVENTION

Photovoltaic devices represent one of the major sources of environmentally clean and renewable energy. They are frequently used to convert optical energy into electrical energy. Typically, a photovoltaic device is made of one semiconducting material with p-doped and n-doped regions. The conversion efficiency of solar power into electricity of this device is limited to a maximum of about 37%, since photon energy in excess of the semiconductor's bandgap is wasted as heat. The commercialization of photovoltaic devices depends on technological advances that lead to higher efficiencies, lower cost, and stability of such devices. The cost of electricity can be significantly reduced by using solar modules constructed from inexpensive thin-film semiconductors such as copper indium di-selenide ($CuInSe_2$ or CIS) or cadmium telluride (CdTe). Both materials have shown great promise, but certain difficulties have to be overcome before their commercialization.

As shown in FIG. 1, the basic form of a CIS, or CdTe, compound semiconductor thin-film solar cell (1) comprises of a multilayer structure superposed on a substrate (2) in the following order, a back electrode (3), a light absorbing layer (4), an interfacial buffer layer (5), a window layer (6) and an upper electrode (7). The substrate is commonly soda-lime glass, metal ribbon or polyimide sheet. The back electrode is commonly a Mo metal film.

The light absorbing layer consists of a thin-film of a CIS p-type $Cu-III-VI_2$ Group chalcopyrite compound semiconductor. e.g copper indium di-selenide (CIS). Partial substitutions of Ga for In (CIGS) and/or S for Se (CIGSS) are common practices used to adjust the bandgap of the absorber material for improved matching to the illumination.

CIS and similar light absorbing layers are commonly formed by various processing methods. These include Physical Vapor Deposition (PVD) processing in which films of the constituent elements are simultaneously or sequentially transferred from a source and deposited onto a substrate. Standard PVD practices and equipment are in use across many industries.

PVD methods include thermal evaporation or sublimation from heated sources. These are appropriate for elemental materials or compounds which readily vaporize as molecular entities. They are less appropriate for multi-component materials of the type discussed here, which may decompose and exhibit preferential transport of subcomponents.

A sub-set of PVD methods are appropriate for single-source, multi-component material deposition, including magnetron sputtering and laser ablation. In these implementations multi-component compounds or physical mixtures of elements, or sub-compounds, are formed into targets. The targets are typically unheated or cooled, and their surface is bombarded with high energy particles, ions or photons with the objective that the surface layer of the target is transported in compositional entirety. In this way complex materials can be deposited. By this means the target composition and molecular structure can be closely replicated in the film. Exceptions occur, most commonly, when targets are made from physical mixtures of elemental or sub-components rather than fully reacted compounds. In such cases the target may be consumed non-uniformly with preferential transport of constituents.

Targets for PVD may be formed by casting, machining or otherwise reforming bulk materials. This includes pressing of powdered materials. Target shapes and sizes vary in different systems and at the end of life the spent target materials are frequently recycled.

In the case of CIS and similar light absorbing layers, evaporation is often used to deposit films of the constituent elements onto the substrate. This may be carried out under a reactive atmosphere of the Chalcogen (Se or Se) or, alternatively, these elements can be subsequently introduced by post processing in reactive atmospheres (e.g, $H_2Se$). Heating of the substrates during deposition and/or post-deposition processing, at temperatures in the range of 500° C. for extended periods, is often employed to promote mixing and reaction of the film components in-situ.

A shortcoming of the conventional multi-source vacuum deposition methods is the difficulty in achieving compositional and structural homogeneity, both in profile and over large areas for device manufacturing. More specifically, device performance may be adversely impacted as a result of such inhomogeneities, including semi-conducting properties, conversion efficiencies, reliability and manufacturing yields. Attempts to remove inhomogeneity through post-deposition processing are imperfect and can generate other detrimental effects. Such post-processing is typically carried out at sub-liquidus temperatures of the thin-film material.

When simultaneous deposition from confocal sources for the constituents is employed, the film composition differs from the designed composition outside the focal region. Such methods are suitable for demonstration, but are more limited in achieving uniform large area depositions as is envisioned for low-cost device manufacturing.

When the deposition is from sequential, or partially overlapping, sources (e.g, strip effusion cells used for in-line processing), the elemental composition of the films vary in profile. Subsequent mixing through thermal inter-diffusion is typically imperfect especially if the processing is constrained by the selection of substrates and other cell components. As an example, in-line deposited GIGS films exhibit graded Ga and In concentrations, consistent with the sequence and overlap of the elemental sources.

In Photovoltaic and other multi-layer devices, reactions and diffusion at film interfaces during deposition or during post-deposition processing may impact performance. For instance it has been shown that Na thermally diffuses from soda-lime substrates into CIS layers. In this instance the effect is found considered beneficial to the performance of the photovoltaic cell. Such effects are a natural consequence of the standard processing and are not independently controlled.

CIGS solar cells have been fabricated at the National Renewable Energy Laboratory (NREL) in Colorado which demonstrate 19.5% conversion efficiency under AM 1.5 illumination. These are small area devices produced by elemental co-evaporation onto soda-lime substrates. Larger area devices, manufactured by vacuum and non-vacuum methods by various entities, on glass, metal ribbon or polymer substrates, more typically demonstrate conversion area efficiencies in the range of 8-12%. It is generally accepted that it is due to shortcomings in the device processing, including the light absorbing layer. In this layer, there can be incomplete compositional non-uniformity, incomplete chemical and/or structural development and/or other defects across area, profile and at the interfaces of the layer.

The aforementioned techniques for manufacturing CIS-based semiconductor thin-films for use in photovoltaic devices have not resulted in cost effective solutions with conversion efficiencies that are sufficient for many practical applications.

SUMMARY OF THE INVENTION

In accordance with the present invention, a method is provided for fabricating a thin-film semiconductor device. The method includes providing a plurality of raw semiconductor materials. The raw semiconductor materials undergo a pre-reacting process to form a homogeneous compound semiconductor target material. This pre-reaction typically includes processing above the liquidus temperature of the compound semiconductor. The compound semiconductor target material is deposited onto a substrate to form a thin-film having a composition substantially the same as a composition of the compound semiconductor target material.

In accordance with one aspect of the invention, the raw semiconductor materials may include II-VI compound semiconductor materials.

In accordance with another aspect of the invention, the II-VI compound semiconductor materials may be selected from the group consisting of Cd—S, Cd—Se, Cd—Te, Cd—Zn—Te, Cd—Hg—Te, and Cu—In—Se.

In accordance with another aspect of the invention, Cu may be provided as a minor constituent along with the II-VI compound semiconductor materials.

In accordance with another aspect of the invention, the raw semiconductor materials may include I-III-VI compound semiconductor materials.

In accordance with another aspect of the invention, the I-III-VI compound semiconductor materials may be selected from the group consisting of Cu—In—Se, Cu—In—Ga—Se, Cu—In—Ga—Se—S.

In accordance with another aspect of the invention, Al may be provided in complete or partial substitution for Ga.

In accordance with another aspect of the invention, Na may be provided as a minor constituent along with the I-III-VI compound semiconductor materials.

In accordance with another aspect of the invention, an alkali element other than Na may be provided as a minor constituent long with the I-III-VI compound semiconductor materials.

In accordance with another aspect of the invention F may be provided as a minor constituent along with the I-III-VI compound semiconductor materials.

In accordance with another aspect of the invention, a halogen element other than F may be provided as a minor constituent along with the I-III-VI compound semiconductor materials.

In accordance with another aspect of the invention, the compound semiconductor target material may be deposited by physical vapor deposition.

In accordance with another aspect of the invention, the compound semiconductor target material may be deposited by magnetron sputtering.

In accordance with another aspect of the invention, the compound semiconductor target material may be deposited by laser ablation.

In accordance with another aspect of the invention, pre-reacting the raw semiconductor materials may include isolating the raw semiconductor materials at an elevated temperature to establish a structure and bonding profile representative of the deposited thin-film.

In accordance with another aspect of the invention, a photovoltaic device, is provided which includes a substrate, a first electrode disposed on the substrate, and a light absorbing layer that includes a Reacted Target Physical Deposition (RTPD) compound semiconductor thin-film. A second electrode is disposed over the light absorbing layer.

DETAILED DESCRIPTION

Figure 1:
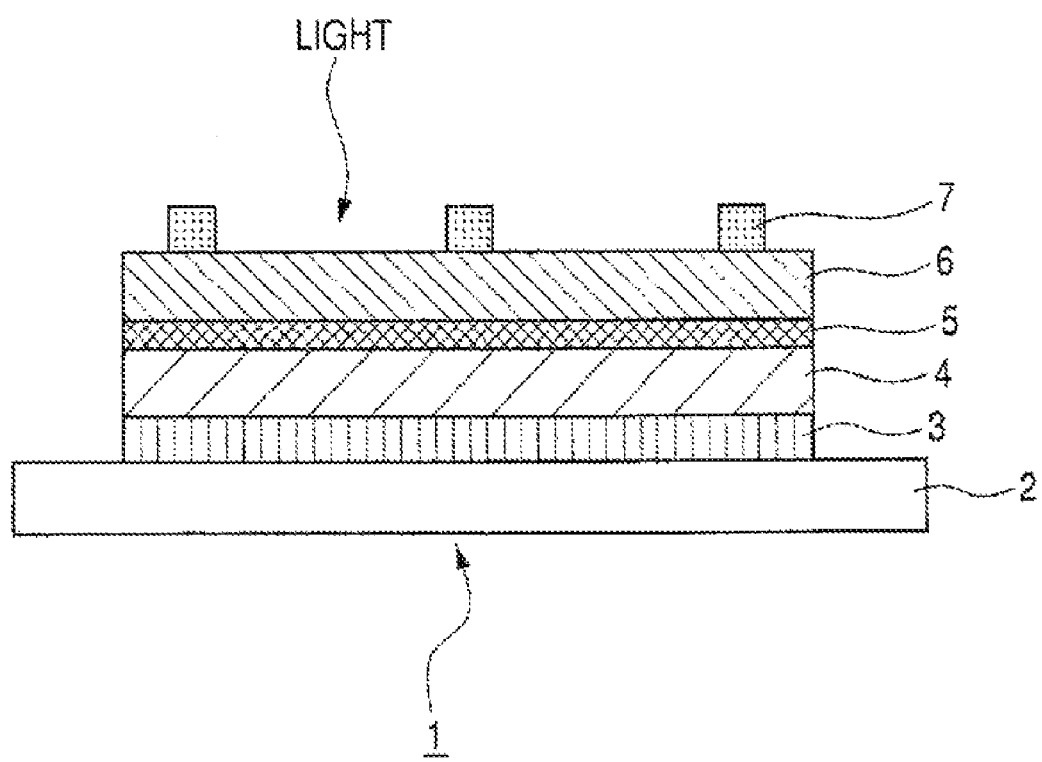
FIG. 1 is a simplified schematic diagram of a CIS or CdTe compound semiconductor thin-film solar cell.

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

The processes of the present invention can be used to fabricate high-quality thin-film copper indium di-selenide (CIS)-based semiconductor devices that have photovoltaic effects and are especially adaptable for solar cell applications. For purposes of simplicity, the description of the processes of this invention will focus primarily on CIS-based structures. However, it should be understood that the processes and techniques described herein are also applicable to the fabrication of a wide variety of other compound semiconductor thin-film structures.

The processes of the present invention involve a Reacted Target Physical Deposition (RTPD) method, which provides an alternative path for forming compound semiconductor thin-films. The RTPD method can produce a uniform film with a designated composition while requiring reduced levels of post-deposition processing in comparison to other established fabrication methods. These attributes impart multiple advantages for the design, performance and manufacture of such films for photovoltaic solar cells and other devices.

Thin-films fabricated in accordance with the RTPD method will have improved compositional, chemical and structural uniformity in both profile and in area. As a consequence, properties which are dependent on uniformity can be improved. Thermal and/or chemical post-deposition processes that are conventionally used to approach such uniformity can also be reduced or eliminated. The latter will be beneficial for minimizing interactions between device layers, process simplification and manufacturing cost reduction.

The RTPD process is comprised of two parts. Specifically, (i) the production of a "pre-reacted" target of designed composition, which is compositionally uniform and has a molecular structure which is representative of the fully formed compound semiconductor and (ii) the use of a physical deposition method, such as magnetron sputtering, which is well suited for depositing thin-film with identical, or near identical, composition and molecular structure to the identified target.

For the RTPD method the pre-reacted target may be made by any available method of synthesis. The key attribute of the target is its pre-reacted nature, which provides a source material for deposition which has a defined composition and molecular structure. This pre-reaction typically includes processing above the liquidus temperature of the compound semiconductor. The objective of the pre-reaction process is to achieve the homogenization and structural definition attributes in the target, in order to simplify film deposition and post processing.

In contrast to the RTPD process, conventional targets made from simple physical mixtures of un-reacted elements or sub-components are generally unsatisfactory for many purposes. The reasons being that (i) the structure and bonding of the compound is not pre-established and (ii) segregated components are likely to exhibit preferential transport.

In some examples, the RTPD process is used to fabricate thin-film compound semi-conductors having layer thicknesses less than about 10 micrometers thick, and more specifically having layer thicknesses of a few micrometers. In regard to CIS and similar materials of the type used in solar cells, the thin-films are typically polycrystalline or microcrystalline in morphology. This is distinct from the structure of epitaxially grown single crystal films, which are also sometimes used in certain solar cell devices. This is also distinct from the structure of some amorphous films, such as amorphous Si, which are sometimes used in other solar cell devices. The RTPD method employs deposition processes, as noted in the above examples, which can produce amorphous or polycrystalline films. Their form can be influenced by the temperature of the substrate during deposition or by thermal annealing after deposition.

For compound semiconductors the preparation of bulk materials and RTPD targets typically require a special approach. Specifically, the raw materials ("the batch"), which include volatile elements such as the Chalcogens, S, Se or Te, should be contained in their entirety in a crucible made from a material which will not react significantly with the target materials or the processing atmosphere. For example, carbon crucibles or carbon coated silica glass vessels may be used. Silica vessels may be evacuated and sealed around the batch of raw materials. Alternatively, crucibles may be placed in a sealed chamber under an appropriate pressure of inert gas such as Argon.

Sealed vessels may be processed in conventional ovens or furnaces. In pressurized chambers heating is provided locally to the crucible and the batch while the chamber walls are unheated or cooled.

The batch should be processed at a sufficient temperature, typically above the liquidus temperature of the compound semiconductor, for a sufficient time to allow the constituents to mix and chemically react so that they may form a homogeneous compound semiconductor body. Enabling such mixing and chemical reaction to occur in the batch will minimize the post-processing required for the RTPD thin-films. Typical processing can be at temperatures in the region of 1000° C. under pressures of many atmospheres.

Certain aspects of the Czochralski single crystal growth method (see, for example, U.S. Pat. No. 4,652,332 by Ciszek) are similar to RTPD target synthesis as they relate to batch processing in a sealed chamber. The goal of the Czochralski method is to pull a single crystal from a melt. In the RTPD method, the goal is wider, covering different processing, solidification practices and material objectives.

During processing in evacuated vessels, equilibrium vapors are formed above the batch. During processing in pressurized chambers, vaporization is inhibited by the overpressure of the inert gas. Component loss in the former case is compensated by adjusting the batch formulation.

The compound semiconductor target produced from the batch in the aforementioned manner may be amorphous, polycrystalline or single crystal in form. This form may be influenced as desired by adjusting, for example, the cooling rate of the batch after high temperature processing.

The RTPD approach also enables beneficial dopants, such as Na in the case of CIS solar cells, to be introduced more uniformly in deposited thin-films by incorporating appropriate precursors in the batch.

The target may be used in the shape in which it is formed in the vessel or crucible. Optionally, the target may be machined or otherwise reformed to an appropriate shape for a given deposition system. In the case of magnetron sputtering targets typical shapes include circular or rectangular plates which are bonded to a metal carrier to facilitate backside cooling during the deposition process.

The compound semiconductor thin-films deposited by the RTPD method using targets fabricated in the manner described above are characterized in that they are uniform in composition and have substantially developed molecular structure and bonding in their as-deposited form, as required in final product. In such thin-films, the optimization of their grain sizes and other desirable features requires less additional processing in terms of time at temperature than films formed by conventional techniques. When conventional techniques are employed, thermal processing is also required to produce the mixing and chemical reaction of the components, whereas in RTPD thin-films these issues are addressed in advance.

The RTPD method can impart many advantages for compound semiconductor thin-film processing over current methods. These include:

1. Processing the batch materials at higher temperatures than in conventional approaches. This facilitates better mixing and more complete reaction of the constituents.
2. Improved compositional control of the principal constituents by target composition. This can facilitate bandgap engineering without processing changes, e.g, the relationship between composition and the bandgap of the compound semiconductor $CuIn_{(1-x)}Ga_x(S_ySe_{(1-y)})_2$ is given by:

$$E_g = 0.95 + 0.8x - 0.17x(1-x) + 0.7y - 0.05y(1-y) \tag{1}$$

3. Improved doping of the thin-films through pre-doping of targets with, e.g, Na.
4. More uniform films with fewer vacancies or other performance limiting defects.
5. Thinner films for reduced materials usage for cost reduction.
6. Films with reproducible compositions over larger areas. For higher yield, throughput and low-cost manufacturing.
7. Process simplifications including (i) elimination of multi source deposition, monitoring and control and (ii) elimination of chemical (e.g Selenization) and/or thermal post-processing steps.
8. If desired, multiple RTPD processing can be used simultaneously or in sequence to engineer compositional grading. It may also be used in combination with other deposition techniques.

By the RTPD method, CIS or similar films can be produced which are more uniform in composition over area and in profile than can achieved by current practices. This uniformity is expected to impart a higher performance, reproducibility and manufacturability for CIS solar cells.

EXAMPLES

1. In one embodiment, a target for RTPD processing is formed from a compound semiconductor material having a specified composition. Examples of which are presented below. The target may be used in a PVD process to form a thin-film semiconductor device such as a photovoltaic device. The raw semiconductor material is pre-reacted to achieve the molecular structure and bonding of the compound. The material may be amorphous, crystalline or polycrystalline in morphology.
2. In another embodiment, a target as described in Example 1, comprises II-VI compound semiconductor materials.
3. In another embodiment a target as described in Example 2 comprises Cd—S.
4. In another embodiment a target as described in Example 2 comprises Cd—Se.
5. In another embodiment a target as described in Example 2 comprises Cd—Te.
6. In another embodiment a target as described in Example 2 comprises Cd—Zn—Te.
7. In another embodiment a target as described in Example 2 comprises Cd—Hg—Te.
8. In another embodiment a target as described in Example 1 comprises Cu—In—Se.
9. In another embodiment a target as described in Examples 3-8 which includes Cu as a minor constituent.
10. In another embodiment a target as described in Example 1 comprises I-III-VI compound semiconductor materials.
11. In another embodiment a target as described in Example 10 comprises Cu—In—Se. The target preferably has a polycrystalline form of $CuInSe_2$.
12. In another embodiment a target as described in Example 10 comprises Cu—In—Ga—Se. The target preferably has a polycrystalline form of $CuIn_{(1-x)}Ga_xSe_2$, where x may be in the range from 0 to 1, preferably between 0.2 and 0.7, more preferably between 0.3 and 0.5. Furthermore, the target may have a preferred composition of $CuIn_{0.7}Ga_{0.3}Se_2$, which may be most suitable for absorber film deposition for use in photovoltaic devices.
13. In another embodiment a target as described in Example 10 comprises Cu—In—Ga—Se—S. The target preferably has a polycrystalline form of $CuIn_{(1-x)}Ga_x(Se_{(1-y)}S_y)_2$, where x and y may be in the range from 0 to 1. Furthermore, x and y may be preferably between 0.2 and 0.7 and between 0 and 0.6. Furthermore, the target may have a preferred composition of $CuIn_{0.4}Ga_{0.6}(Se_{0.4}S_{0.6})_2$, which may be most suitable for wide-bandgap absorber film deposition for use in photovoltaic devices.
14. In another embodiment a target as described in Examples 12 and 13 which includes Al in complete or partial substitution for Ga. The target may have a preferred composition of $CuIn_{0.5}Al_{0.5}Se_2$, which may be suitable for wide-bandgap absorber film deposition for use in photovoltaic devices.
15. In another embodiment a target as described in Examples 10-14 which includes Na as a minor constituent. The target preferably contains less than 1 at. % of sodium, more preferably less than 0.1 at. % of sodium.
16. In another embodiment a target as described in Examples 10-15 which includes alkali elements other than Na as minor constituents.
17. In another embodiment targets as described in Examples 10-16 which includes F as a minor constituent.
18. In another embodiment targets as described in Examples 10-17 which include a halogen element other than F as minor constituents.
19. In another embodiment a RTPD method is used to form a homogeneous thin-film from a compound semiconductor target which closely replicates the composition of the target.
20. In another embodiment a RTPD method is used to form a homogeneous thin-film from a compound semiconductor target, in combination with other material sources for simultaneous or sequential depositions.
21. In another embodiment a method as described in example 20 is used which includes multiple RTPD target deposition steps.
22. In another embodiment a method as described in example 20 is used along with additional deposition steps other than RTPD deposition steps.
23. In another embodiment a method as described in Examples 19-22 is used which includes magnetron sputtering.
24. In another embodiment a method as described in Example 19-22 is used which includes laser ablation.
25. In another embodiment a method as described in Example 19-22 is used which includes nano-particle deposition.
26. In another embodiment, the RTPD method as described above may be used to deposit a thin-film of a compound semiconductor onto a substrate, which may be flat, textured or curved. The compound semiconductor material may be $CuInSe_2$ and the resulting film may have a thickness in the range of 1-10 microns, preferably about 1-2 microns. The substrate material may be glass, preferably soda lime glass or Corning 1737 glass having a coefficient of thermal expansion (CTE) close to that of CIS-type materials. The substrate may further include additional thin-film layers, for example such as dielectric barrier layers maid from $SiO_2$ or $Si_3N_4$, or conducting layers maid from Mo or W films.
27. In another embodiment, the thin-film described above may be modified to include a thin-film of $CuIn_{0.7}Ga_{0.3}Se_2$.
28. In another embodiment, the thin-film described above may be modified to include a thin-film of $CuIn_{0.5}Al_{0.5}Se_2$.
29. In another embodiment, the thin-film described above may be modified to include a thin-film of $CuInS_2$.
30. In another embodiment, the thin-film described above may be modified to include a thin-film of $CuGaSe_2$.
31. In another embodiment, the thin-film described above may be modified to include a thin-film of CdTe.
32. In another embodiment, the thin-film described above may be modified to include a thin-film of a compound semiconductor having thickness of less than 1 micron, and preferably less than 0.5 micron, which leads to cost reductions in the manufacturing of electro-optic devices containing such a film.
33. In another embodiment, the thin-film described above may be modified by annealing at temperature of at least 450° C., preferably at 500° C. or above, which would promote crystal grain growth and improve electro-optic properties of this film, such as electron and hole mobilities, carrier lifetime, and optical quantum efficiency.
34. In another embodiment, the thin-film may be deposited on a stainless steel substrate. The stainless steel may further contain at least 13% of Cr, preferably 16-18% of Cr. The stainless steel substrate may also be polished to have surface roughness of less than 10 nm, and preferably of less than 2 nm.
35. In another embodiment, the thin-film may be deposited on a polyimide substrate. Furthermore, the film may be annealed at temperatures of at least 400° C.
36. In another embodiment, the thin-film may be deposited on a low temperature polymer substrate, such as polyamide or polyethylene terephthalate (PET). Furthermore, the film may be annealed at temperatures of 300° C. or less. The RTPD process may enable grain growth at lower temperatures as compared to those of regular film deposition approaches.

37. In yet another embodiment, the RTPD method described above may be used to produce an electro-optic device that includes at least one semiconductor junction having a thin-film of a compound semiconductor deposited using the RTPD method. The junction may be formed at the interface between said RTPD thin-film and another semiconductor film. The conduction types may be opposite on opposite sides of the junction so that the junction may be a PN type junction. In addition, the device may include at least two conducting layers and a substrate for supporting all of the described layers. At least one the conducting layers may be transparent.
38. In another embodiment, the device described above is a photovoltaic (PV) device.
39. In another embodiment, the device described above includes a heterojunction.
40. In another embodiment, the device described above includes a MIS (metal-insulator-semiconductor) type junction.
41. In another embodiment, the device described above includes a thin-film of a I-III-VI compound semiconductor, such as a CIGS-type material.
42. In another embodiment, the device described above includes a thin-film of a II-VI compound semiconductor, such as CdTe.
43. In another embodiment, the device described above includes a stack of a glass substrate, Mo metal layer, CIS layer, CdS layer, i-ZnO layer and n-ZnO layer. It may also be preferred to omit the CdS layer and avoid Cd contamination without detrimental effects to the device performance.
44. In another embodiment, the device described above includes a thin-film of wide-bandgap compound semiconductor having a bandgap greater than 10.4 eV, preferably greater than 1.55 eV, and more preferably greater than 1.7 eV.
45. In another embodiment, the device described above includes a homogeneous thin-film of wide-bandgap compound semiconductor having an open circuit voltage greater than 0.8 V, preferably more than 0.9 V.
46. In another embodiment, the device described above includes a homogeneous thin-film of a compound semiconductor having a large area of greater than 100 cm$^2$ and power conversion efficiency greater than 15%.
47. In another embodiment, the device described above includes a homogeneous thin-film of CIGS-type semiconductor having a large area of greater than 100 cm$^2$ and a power conversion efficiency greater than 15%.
48. In yet another embodiment, the RTPD method described above may be used to produce an electro-optic device that includes a plurality of modules. Each module has at least one semiconductor junction formed by a thin-film of a compound semiconductor deposited using the RTPD method and another adjacent semiconductor layer. Such a device may be a multi-junction PV device, which is known to be potentially a more efficient PV device than single-junction PV devices. A multi-junction PV device requires different semiconductor layers, each having a different bandgap. For example, in the case of a triple junction PV device, it may be preferred to have semiconductors with bandgaps of about 1.0 eV, 1.4 and 1.8 eV. Standard CIGS film deposition methods fail to produce homogeneous films with a uniform bandgap across the film; the resulting films are often characterized by poorly defined and controlled graded-bandgap profiles. Thus, it has been difficult to define a bandgap in a multijunction PV device using standard approaches. On the other hand, the RTPD method is more suitable to production of multi-junction devices, since well-defined bandgap materials can be easily produced and precisely deposited across large areas.
49. In another embodiment, the device described above includes homogeneous thin-films of three different CIGS type semiconductors: $CuInSe_2$, $CuIn_{0.6}Ga_{0.4}Se_2$ and $CuIn_{0.6}Ga_{0.4}(S_{0.6}Se_{0.4})_2$.
50. In another embodiment, the RTPD semiconductor thin-film semiconductor materials described above may be incorporated in a photovoltaic device of the types disclosed in copending U.S. application Ser. No. 12/034,944 entitled "METHOD AND APPARATUS FOR MANUFACTURING MULTI-LAYERED ELECTRO-OPTIC DEVICES," which is hereby incorporated by reference in its entirety
51. In another embodiment, the RTPD semiconductor thin-film semiconductor materials described above may be formed on a substrate in which an electrically conducting grid is embedded, which is disclosed in copending U.S. application Ser. No. 12/038,893 entitled "METHOD AND APPARATUS FOR FABRICATING COMPOSITE SUBSTRATES FOR THIN-FILM ELECTRO-OPTICAL DEVICES," which is hereby incorporated by reference in its entirety.
52. In another embodiment, a target is provided which is comprised of a II-VI compound semiconductor, with a composition formulated to give a specific bandgap in the resultant thin-films. Specifically, the target may comprise the elements Cd, Te, Se, and/or S.
53. In another embodiment the target described in 52 is processed at temperatures above the liquidus temperature of the compound semiconductor.
54. In another embodiment, a set of targets as described in 52 with compositions designed to give complimentary band gaps for a multi-junction device.
55. In another embodiment, a target as described in 52 is doped with Cu to improve film performance.
56. In another embodiment, a pre-reacted target is provided which is comprised of a I-III-VI compound semiconductor, with a composition formulated to give a specific bandgap in the resultant thin-films. Specifically, the target may be comprised of the elements Cu,In.Ga.Al,S, Se and/or Te.
57. In another embodiment the target described in 56 is processed at temperatures above the liquidus temperature of the compound semiconductor.
58. In another embodiment, a set of targets is provided as described in 56 with compositions designed to give complimentary band gaps for a multi-junction device.
59. In another embodiment, a target as described in 56 is doped with Na or Li to improve film performance.
60. In another embodiment, a target as described in 56 is doped with F or Cl to improve film performance.

Figure 2:
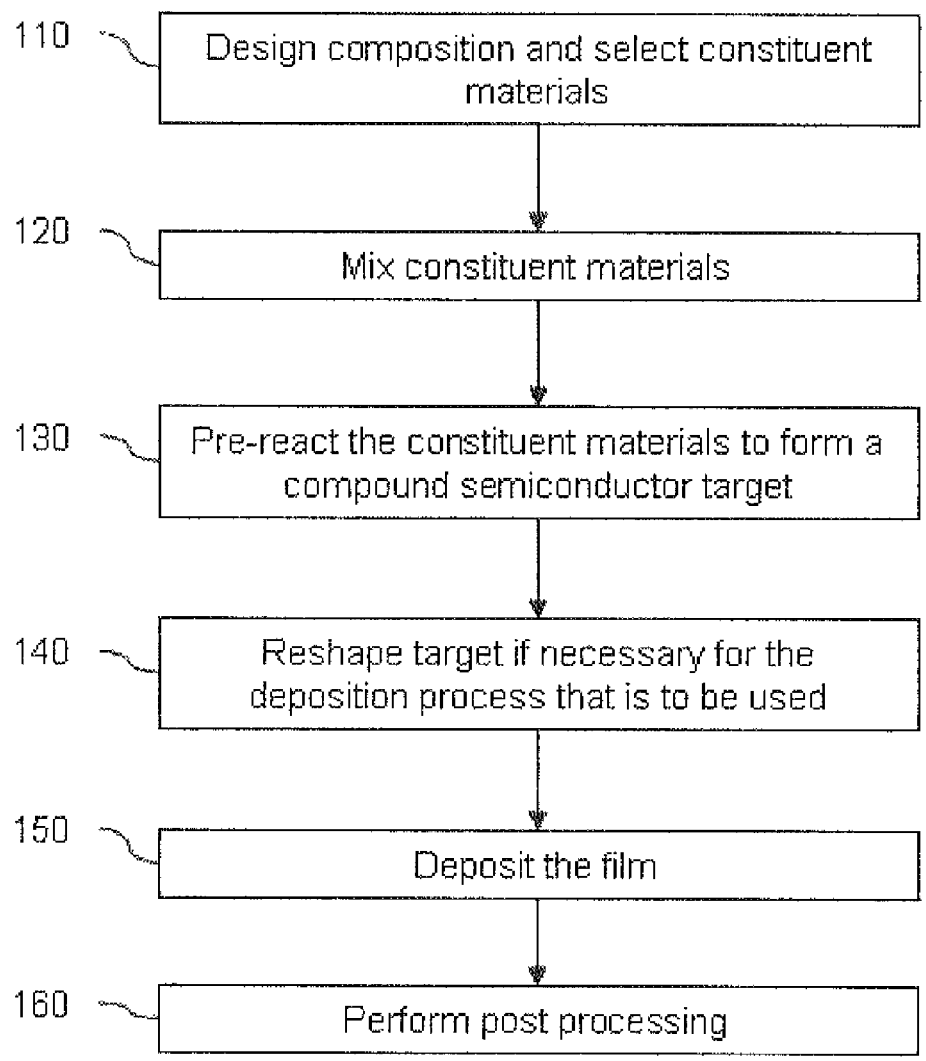
FIG. 2 is a flowchart showing one example of a process that may be employed to fabricate a thin-film semiconductor device such as a photovoltaic device.

FIG. 2 is a flowchart showing one example of a process that may be employed to fabricate a thin-film semiconductor device such as a photovoltaic device. The method begins in step 110 when the absorber layer of the semiconductor device is designed by selecting the constituent elements or compounds. Next, in step 120 these constituent materials are mixed together and, in step 130, undergo a pre-reacting process to form a homogeneous compound semiconductor target material (i.e., an RTPD target material). The target material is optionally reshaped or otherwise reconfigured in step 140 as appropriate for the deposition technique that will be employed. The target material is then deposited on a suitable substrate by the selected deposition technique in step 150. The resulting thin-film has a composition that is substantially the same as the composition of the compound semiconductor target material. Finally, in step 160 any post-processing that is necessary is performed on the thin-film.

The invention claimed is:

1. A method of fabricating a thin-film semiconductor device, comprising:
    providing a plurality of raw semiconductor materials;
    pre-reacting the raw semiconductor materials to form a homogeneous compound semiconductor target material; and
    depositing the compound semiconductor target material onto a substrate to form a thin-film having a composition substantially the same as a composition of the compound semiconductor target material.

2. The method of claim 1 wherein the raw semiconductor materials include II-VI compound semiconductor materials.

3. The method of claim 2 wherein the II-VI compound semiconductor materials are selected from the group consisting of Cd—S, Cd—Se, Cd—Te, Cd—Zn—Te, Cd—Hg—Te, and Cu—In—Se.

4. The method of claim 3 further comprising providing Cu as a minor constituent along with the II-VI compound semiconductor materials.

5. The method of claim 1 wherein the raw semiconductor materials include I-III-VI compound semiconductor materials.

6. The method of claim 5 wherein the I-III-VI compound semiconductor materials are selected from the group consisting of Cu—In—Se, Cu—In—Ga—Se, Cu—In—Ga—Se—S.

7. The method of claim 6 further comprising providing Al in complete or partial substitution for Ga.

8. The method of claim 5 further comprising providing Na as a minor constituent along with the I-III-VI compound semiconductor materials.

9. The method of claim 5 further comprising providing an alkali element other than Na as a minor constituent long with the I-III-VI compound semiconductor materials.

10. The method of claim 9 further comprising providing F as a minor constituent along with the I-III-VI compound semiconductor materials.

11. The method of claim 9 further comprising providing a halogen element other than F as a minor constituent along with the I-III-VI compound semiconductor materials.

12. The method of claim 1 wherein the compound semiconductor target material is deposited by physical vapor deposition.

13. The method of claim 12 wherein the compound semiconductor target material is deposited by magnetron sputtering.

14. The method of claim 12 wherein the compound semiconductor target material is deposited by laser ablation.

15. The method of claim 1 wherein pre-reacting the raw semiconductor materials includes isolating the raw semiconductor materials at an elevated temperature to establish a structure and bonding profile representative of the deposited thin-film.

16. A thin-film semiconductor device fabricated in accordance with the method set forth in claim 1.

17. The method of claim 1 wherein the raw semiconductor materials are pre-reacted above a liquidus temperature of the compound semiconductor target material.

* * * * *